United States Patent [19]

Takasaki

[11] 4,384,933
[45] May 24, 1983

[54] METHOD OF REACTIVE SPUTTERING

[75] Inventor: Kanetake Takasaki, Tokyo, Japan

[73] Assignee: Fujitsu Limited, Kawasaki, Japan

[21] Appl. No.: 275,737

[22] Filed: Jun. 22, 1981

[30] Foreign Application Priority Data

Jun. 24, 1980 [JP] Japan .................................. 55-85325

[51] Int. Cl.³ ............................................. C23C 15/00
[52] U.S. Cl. ................................ 204/192 D; 156/643;
204/298
[58] Field of Search ........................... 204/192 D, 298;
156/643

[56] References Cited

PUBLICATIONS

Shibagaki et al., Jap. J. Applied Physics 17 (1978), Supplement 17-1, pp. 215-221.

Primary Examiner—Arthur P. Demers
Attorney, Agent, or Firm—Staas & Halsey

[57] ABSTRACT

A method of reactive sputtering wherein inert gas and reactive gas are introduced into a reaction chamber provided with a pair of oppositely arranged electrodes, on one of which is placed a semiconductor substrate to be treated and a target material is placed on the other electrode, an RF power is applied to the latter electrode to generate plasma which activates the inert gas to eject silicon particles from the target material for reaction with nitrogen radical for forming a film of silicon nitride on the substrate, the invention improves the quality of the film as well as its growth rate by activating reactive gas before it is introduced into the reaction chamber. A microwave oscillator is used for activating the reactive gas, and the electrode on which the target material is placed comprises a magnetron.

7 Claims, 7 Drawing Figures

METHOD OF REACTIVE SPUTTERING

BACKGROUND OF THE INVENTION

This invention is related to an improvement of the known method of reactive sputtering.

In the field of depositing or growing a thin film on the surface of a material to be treated such as a semiconductor substrate, the methods of chemical vapour deposition and physical vapour deposition have generally been practiced. The sputtering can be understood to belong to the method of physical vapour deposition.

However, the reactive sputtering for growing a film on the semiconductor substrate is a method in which a synergetic effect of the chemical and physical vapour depositions is achieved. In contrast to the chemical vapour depositions method, the temperature under which the film is deposited is relatively low in the reactive sputtering method, and the adhesive characterictic of the film is substantially enhanced. Thus, the method of reactive sputtering is effective to form an insulating film to cover the semiconductor devices or to insulate interconnecting layers already fabricated on a semiconductor substrate.

Particularly, in the reactive sputtering method which uses a magnetron sputtering apparatus, crossed (at right angles) electric and magnetic fields are created near a target material to enhance the efficiency in generating plasma for activating the reactive gas. And thus, with a relatively low degree of vacuum, atoms ejected by sputtering and a reactive gas are caused to react efficiently with each other. Because of this, the reactive sputtering method excells in forming a quality film having a high degree of adhesiveness, and has come to be frequently used.

In spite of these advantages found with the magnetron sputtering apparatus, it is extremely difficult to form at a high rate of growth a film which is stable both chemically and electrically.

SUMMARY OF THE INVENTION

It is therefore the primary object of the present invention to solve the technical problem described above and to offer a method of fabrication of an insulating film which is chemically and electrically stable.

It is another object of the present invention to form such a stable film at a relatively low degree of vacuum with a growth rate which is faster than that according to the conventional art.

In order to achieve the above and other objects of the invention, reactive gas is activated in advance and then introduced into a reaction chamber, and the particles ejected from a target material in the reaction chamber and said reactive gas are caused to react to form a desired film on the surface of a substrate to be treated at a high rate of growth.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

In the drawings wherein like parts are marked alike.

DESCRIPTION OF THE PREFERRED EMBODIMENT

Figure 1:
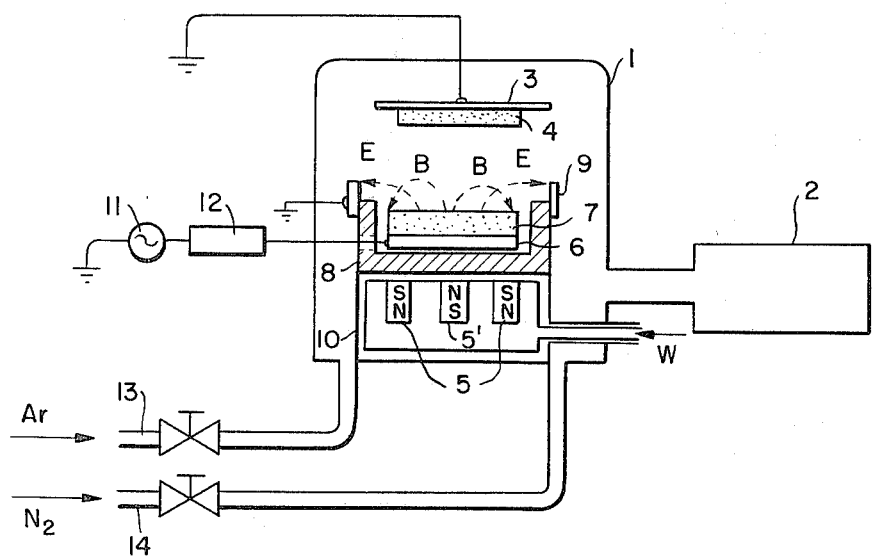
FIG. 1 is a schematic cross-sectional view of a conventional sputtering apparatus.

Referring first to FIG. 1 which shows in cross-section a conventional magnetron sputtering apparatus, air is exhausted from a reaction chamber 1 made of glass or stainless steel which may be for example an apparatus called Type CFS-8EP, a product of Tokuda Co., Ltd. of Kanagawa, Japan by a known vacuum pump system 2 comprising a rotary pump and cryo pump, not shown which is capable of attaining a degree of vacuum in order of $5 \times 10^{-7}$ Torr. The chamber 1 is a cylindrical structure having a diameter and a height of approximately 50 cm and 60 cm respectively. There are provided in the chamber 1 a couple of oppositely arranged electrodes and a semiconductor substrate 4, for example, a silicon wafer, is placed on one electrode 3 which is shown grounded in the drawing, but may otherwise be left floating. Opposite to the electrode 3, there is provided a cathode 6 on which is placed a target material 7 having a diameter of 12.7 cm (5 inch). The cathode 6 is enclosed within an insulator 8 of silica or ceramic having anodes 9 attached to its upper end portions. These anodes 9 are grounded as shown. There are provided a hollow tubular magnet 5 and a rod-shaped magnet 5' enclosed with the magnet 5 with their polarities as shown. These magnets are in turn enclosed within a tank 10 to which cooling water W is supplied in the direction as shown by an arrow. The cathode 6 is connected, via matching box 12 to an RF (13.56 MHz) power source 11. By this arrangement, there are created magnetic fields B and electric fields E which cross at right angles as shown. The distance between the surfaces of the substrate 4 and the target material 7 is approximately 10 cm.

Where it is desired to grow a film of silicon nitride (SiN) on the surface of semiconductor substrate 4 by the reactive sputtering, the 13.56 MHz power is applied from the source 11 via a matching box 12, and inert gas such as argon (Ar) gas and a reactive gas, such as nitrogen ($N_2$) gas, are introduced into the reactive chamber 1 through inlets 13 and 14 equipped with a flow meter and a valve respectively. A target material 7, for example, silicon is selected for the purpose of growing or forming said film, and by impact of activated argon ions ($Ar^+$) on the target material 7, silicon particles are ejected therefrom to be caused to react with nitrogen radicals ($N_2^*$). A film of SiN is thus formed on the surface of semiconductor substrate 4.

In this method, however, it is difficult to grow at a high growth rate a film of SiN that comes close to $Si_3N_4$ which is in a stable state stoichiometrically. A film of SiN formed in the manner described above often contains excessive silicon and a film of inferior insulating quality frequently results.

Figure 2:
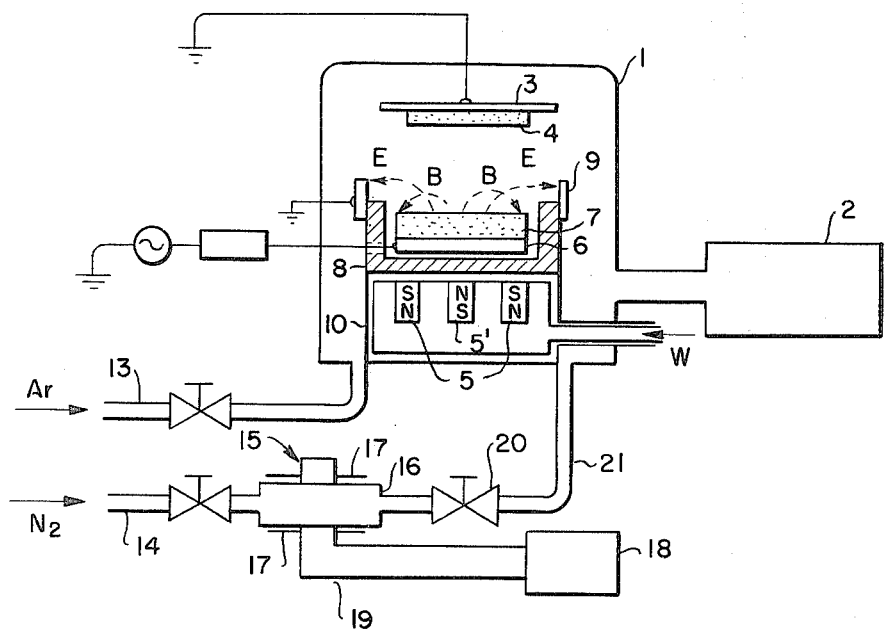
FIG. 2 is a view of an apparatus by which the method of the present invention is carried out.

An apparatus which has been developed to carry out a method for overcoming the abovedescribed deficiency of the prior art is shown in a schematic cross-sectional view of FIG. 2. With this apparatus, the arrangement within the reactive chamber 1 is the same as that shown in, and described by reference to, FIG. 1. However, nitrogen (N$_2$) gas which is supplied from the inlet 14 is activated in a plasma generator 15 comprising a silica chamber 16 enclosed by shield plates 17. Microwave of 2.45 GHz, power 1 KW generated by a microwave oscillator 18 is led through a waveguide 19 arranged to cross the silica chamber 16, and causes nitrogen gas which is introduced into the silica chamber 16, gas pressure in order to $10^{-1}$ Torr, to be turned into plasma. Nitrogen radicals (N$_2$*) which have been created in plasma remains in its activated state even when introduced into the chamber 1 after having passed through a pipe of teflon, for example, of several meters length via another valve 20.

Silicon particles ejected from the target material 7, by the impact argon ions (Ar$^+$) activated in the reaction chamber 1 by high frequency power, react efficiency with nitrogen gas (N$_2$), and thus a film of SiN which is very close to stoichiometrically stable Si$_3$N$_4$ is rapidly grown on the surface of semiconductor substrate 4.

Figure 3:
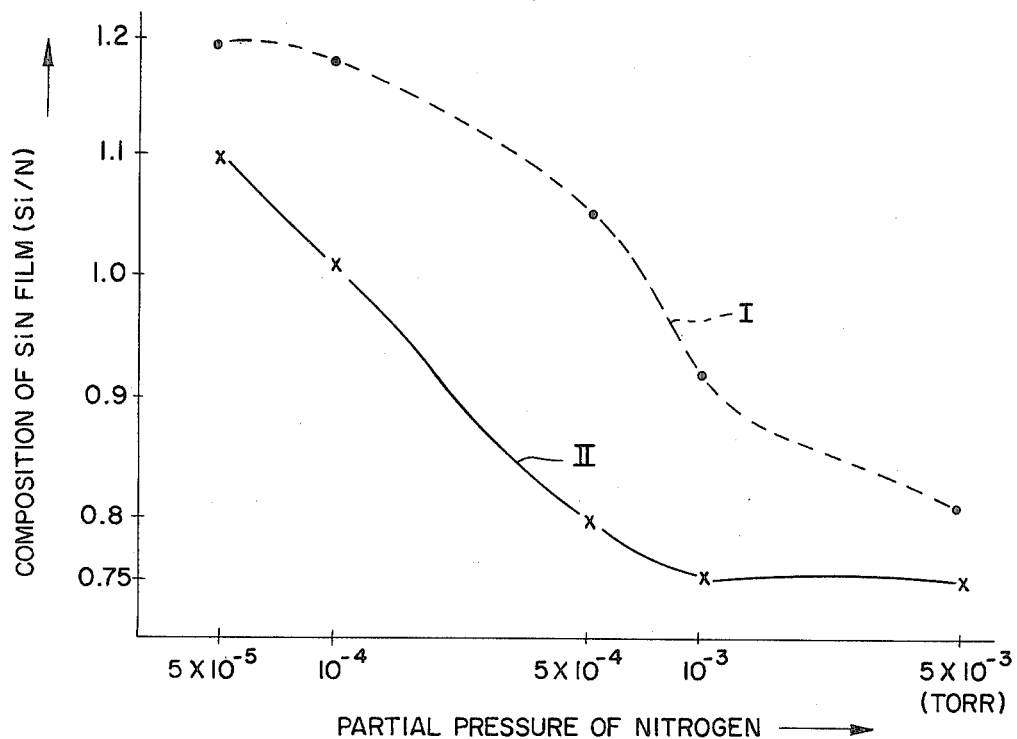
FIGS. 3 and 4 are graphs of data obtained with the films formed by the apparatus of FIG. 2.
Figure 4:
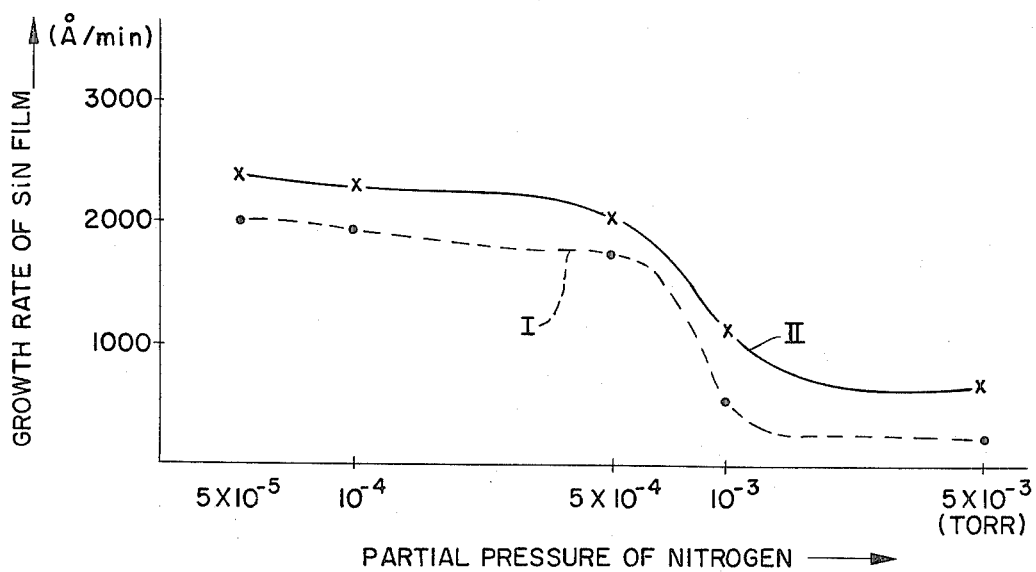

FIGS. 3 and 4 show the composition and growth rate respectively of SiN film formed as described above, with the total gas pressure of activated nitrogen gas and untreated argon gas both introduced in the chamber being kept at $5 \times 10^{-3}$ Torr, the RF power in the reaction chamber 1 is 800 W. In both of these figures, curves I represent data where nitrogen (N$_2$) gas is introduced into the reaction chamber 1 without previous treatment as was done in the conventional reactive sputtering, and curves II represent data obtained by the method of the present invention.

The graphs of FIG. 3 illustrate the relationship between the partial pressure of nitrogen (N$_2$) gas and the composition of SiN film obtained by an X-ray photoelectron spectroscopy or electron spectroscopy for chemical analysis (ESCA). According to the method of the invention, the quantity of nitrogen contained in the film of SiN is large even where the volume of nitrogen gas is reduced. This fact reflects that the ratio of silicon to nitrogen (Si/N) of SiN of the invention approaches that of Si$_3$N$_4$ in which Si/N=0.75 even if a small quantity of nitrogen gas is supplied.

FIG. 4 shows the relationship between the partial pressure of nitrogen (N$_2$) gas and the growth rate of the film of SiN formed by the conventional method and the method of the present invention respectively with the total gas pressure (the pressure of N$_2$ gas + Ar gas) being kept constant. The data show clearly that the growth rate under the present invention is higher than that under the conventional method.

The test results show that according to the method of the present invention, a good insulating film of SiN which is stoichiometrically very close to Si$_3$N$_4$ may be grown at a rate of 1000 A per minute.

Figure 5A:
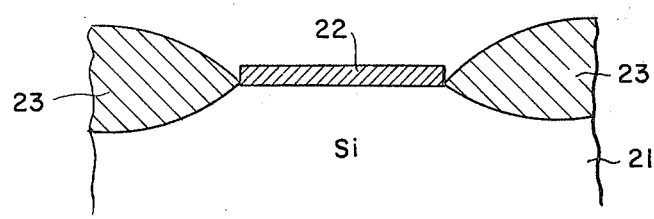
FIGS. 5A to 5C are cross-sectional views of devices having films fabricated by the apparatus of FIG. 2.
Figure 5B:
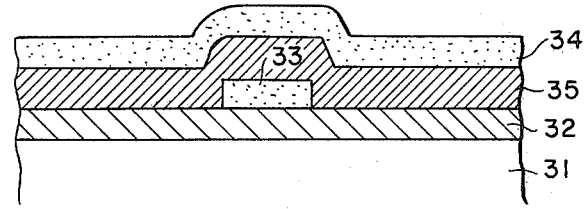
Figure 5C:
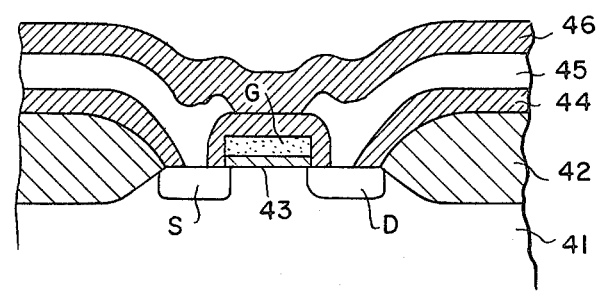

FIGS. 5A, 5B and 5C show applications of the film formed by the method of the invention. In FIG. 5A which shows a cross-section of a semiconductor device in the process of manufacture, a film 22 of Si$_3$N$_4$ is grown approximately 1000 A thick directly or through a very thin film of silicon dioxide (SiO$_2$) on a silicon substrate 21 in accordance with the method of the invention.

A thick insulating layer 23 of SiO$_2$ is fabricated by a subsequent heat treatment using the film 22 of Si$_3$N$_4$ as a mask. This is the well known process called a selective field oxidation.

In FIG. 5B, a film 32 of SiO$_2$ is formed on a silicon substrate 31. A first wiring or interconnecting layer 33 of aluminum is fabricated on the SiO$_2$ film 32. A film 35 of Si$_3$N$_4$ is then grown according to the method of the invention to form an insulating layer between the first aluminum wiring layer 33 and a second wiring layer 34 of aluminum to be subsequently fabricated. This is an example of interlayer insulation of multilayer wirings wherein the film 35 of Si$_3$N$_4$ replaces that of phosphosilicate glass in the prior art.

FIG. 5C shows a silicon gate MOS field effect transistor with inter-layer insulation. There are formed in a silicon substrate 41 source region S and drain region D each of which is isolated by field insulating regions 42. A gate G of polycrystalline silicon is fabricated on an insulating film 43 of SiO$_2$. An insulating layer 44 of Si$_3$N$_4$ is grown using the method of the invention. Interconnecting wiring layer 45 is then fabricated as shown on which a cover film 46 of Si$_3$N$_4$ is grown approximately 1 $\mu$m thick again by the method of the invention. Conditions of forming this film 46 which is 1 $\mu$m thick are: pressure of argon (Ar) gas $4 \times 10^{-3}$ Torr, that of nitrogen (N$_2$) gas $1 \times 10^{-3}$ Torr, power 800 W, frequency 13.56 MHz. It took ten (10) minutes to grow this film which indicates growth rate of 1000 A/minute. The frequency of microwave utilized was 2.45 GHz at power of 1 KW, and the pressure within the chamber 16 of FIG. 2 was $10^{-1}$ Torr.

In the foregoing description of the embodiments of the invention, nitrogen (N$_2$) gas was selected as reactive gas in forming or growing a film of SiN. However, other gases such as oxygen (O$_2$) gas, nitric monoxide (NO) gas, nitrous oxide (N$_2$O) gas or mixed gas of some of these may be used as reactive gas. A target material may be selected from a group of aluminum (Al), titanium (Ti), tantalum (Ta) and so forth.

The method of the invention is not confined to the formation of SiN film, but may also be applied to the formation of compounds such as oxides or nitrides to which the reactive sputtering method can be applied. The product obtained by the method of the invention is not limited to the insulating film.

As has been described, the method of reactive sputtering may be carried out to form a stable reactive compound at a high growth rate according to the present invention. And thus, the invention serves the purpose of upgrading the quality of components in semiconductor devices in addition to improving efficiency of the manufacturing operations.

Thus, the invention having been described in its best embodiment and mode of operation, that which is claimed and desired to be protected by Letters Patent is:

1. A method of reactive sputtering in an apparatus having a pair of electrodes arranged opposing one another in a reaction chamber, said method comprising the steps of:
   (a) positioning a substrate on one electrode and a target material on the opposing electrode in the reaction chamber;
   (b) introducing into the reaction chamber an inactive gas;
   (c) activating a reactive gas and introducing the same into the reaction chamber;
   (d) exciting the inactive gas by applying a high frequency power across the electrodes;
   (e) activating the target material by the excited inactive gas causing particles to be emitted from the target material;
   (f) forming on the surface of the substrate a product of reaction, by the reaction of the particles emitted from the target material and the excited activated reactive gas.

2. A method of claim 1 which is characterized in that said reactive gas is nitrogen gas and said target material is silicon.

3. A method of claim 1, wherein said reactive gas is selected from a group comprising oxygen ($O_2$), nitric monoxide (NO), nitrous oxide ($N_2O$) or mixture of some of these, and said target material is selected from a group comprising aluminum (Al), titanium (Ti) and tantalum (Ta).

4. An apparatus for carrying out processes of reactive sputtering which comprises:
- a reaction chamber including a pair of electrodes opposing one another for respectively supporting a material to be treated and a target material;
- a vacuum pump system operatively connected to said reaction chamber;
- a high frequency power source operatively connected to at least one of said electrodes;
- a first inlet in said reaction chamber for an inactive gas;
- a second inlet in said reactive chamber for receiving activated reactive gas;
- a plasma generator operatively connected to said second inlet for producing the activated reactive gas.

5. An apparatus of claim 4 which is characterized in that said electrode on which said target material is placed comprises a magnetron.

6. An apparatus of claim 4 which is characterized in that said plasma generator comprises a microwave oscillator.

7. A method according to claim 1, wherein the inactive gas comprises Argon.

* * * * *

UNITED STATES PATENT AND TRADEMARK OFFICE
CERTIFICATE OF CORRECTION

PATENT NO. : 4,384,933

DATED : May 24, 1983

INVENTOR(S) : Kanetake Takasaki

It is certified that error appears in the above-identified patent and that said Letters Patent is hereby corrected as shown below:

Column 3, line 17, "efficiency" should be --efficiently--;

Column 3, line 54, "A" should be --Å--;

Column 3, line 59, "A" should be --Å--.

Column 4, line 23, "A" should be --Å--.

Signed and Sealed this

Twenty-seventh Day of September 1983

[SEAL]

Attest:

GERALD J. MOSSINGHOFF

Attesting Officer     Commissioner of Patents and Trademarks